United States Patent
Hsing Chen et al.

(10) Patent No.: US 9,224,923 B2
(45) Date of Patent: Dec. 29, 2015

(54) LIGHT ENHANCING STRUCTURE FOR A LIGHT EMITTING DIODE

(71) Applicant: PROLIGHT OPTO TECHNOLOGY CORPORATION, TaoYuan County (TW)

(72) Inventors: Chen-Lun Hsing Chen, TaoYuan County (TW); Jung-Hao Hung, TaoYuan County (TW); Ding-Yao Lin, TaoYuan County (TW)

(73) Assignee: PROLIGHT OPTO TECHNOLOGY CORPORATION, TaoYuan (TW)

( * ) Notice: Subject to any disclaimer, the term of this patent is extended or adjusted under 35 U.S.C. 154(b) by 0 days.

(21) Appl. No.: 14/308,706

(22) Filed: Jun. 18, 2014

(65) Prior Publication Data

US 2015/0091033 A1   Apr. 2, 2015

(30) Foreign Application Priority Data

Oct. 1, 2013   (TW) .............................. 102135532 A

(51) Int. Cl.
*H01L 33/20* (2010.01)
*H01L 33/46* (2010.01)
*H01L 33/60* (2010.01)
*H01L 33/40* (2010.01)

(52) U.S. Cl.
CPC ................ *H01L 33/46* (2013.01); *H01L 33/20* (2013.01); *H01L 33/60* (2013.01); *H01L 33/405* (2013.01); *H01L 2224/32245* (2013.01); *H01L 2224/48091* (2013.01); *H01L 2224/48247* (2013.01); *H01L 2924/00* (2013.01)

(58) Field of Classification Search
CPC ......... H01L 33/20; H01L 33/60; H01L 33/46; H01L 33/32; H01L 33/54; H01L 33/58; H01L 33/486; H01L 2924/01079; H01L 33/405; H01L 2224/32245; H01L 2224/48091; H01L 224/73265
USPC ............ 257/98, 99, 96, E33.067; 438/22, 25, 438/26, 27, 29
See application file for complete search history.

(56) References Cited

U.S. PATENT DOCUMENTS

| 4,092,659 A | * | 5/1978 | Ettenberg | ................... 372/49.01 |
| 6,255,129 B1 | * | 7/2001 | Lin | ................. 438/26 |
| 2012/0235189 A1 | * | 9/2012 | Hsu | ................................ 257/98 |

FOREIGN PATENT DOCUMENTS

| TW | M378464 U | 4/2010 |
| TW | 201031031 A | 8/2010 |

\* cited by examiner

*Primary Examiner* — Thinh T Nguyen
(74) *Attorney, Agent, or Firm* — CKC & Partners Co., Ltd.

(57) ABSTRACT

A light enhancing structure includes a light emitting diode in it and at least one coating layer. The light emitting diode unit includes a plurality of surfaces and a light-emitting surface. The light-emitting surface is for allowing a plurality of lights generated inside the light emitting diode unit to emit through. The coating layer is formed on the surfaces for blocking or reflecting one of the lights generated inside the light emitting diode unit, and to light intensity of the light emitting diode unit is enhanced.

8 Claims, 4 Drawing Sheets

LIGHT ENHANCING STRUCTURE FOR A LIGHT EMITTING DIODE

RELATED APPLICATIONS

The application claims priority to Taiwan Application Serial Number 102135532, filed on Oct. 1, 2013, which is herein incorporated by reference.

BACKGROUND

1. Technical Field

The present disclosure relates to a light enhancing structure for a light emitting diode, especially relates to a light enhancing structure for a top emitting light of a light emitting diode.

2. Description of Related Art

Light emitting diodes have been attracted high attentions in the lighting industry. Characteristics of the light emitting diodes such as its low energy consumption, high lighting efficiency and longer life time, are superior to conventional lighting devices. The light emitting diode can be manufactured by a photolithography technology thereby can be highly integrated to a manufacturing process of an IC. Therefore, in the modern electric device, it commonly utilizes light emitting diodes as a backlight source.

Light emitting diode can be classified into two kinds, organic light emitting diode and inorganic light emitting diode. Owing to native limitation on the material of the organic light emitting diode, the lighting efficiency and the reliability thereof are inferior to that of the inorganic light emitting diode. Therefore, the inorganic light emitting diode is more commonly used in the field of solid lighting.

Conventionally, an inorganic light emitting diode is formed by multiple semiconductor layers. In a basic inorganic light emitting diode structure, a p-type semiconductor layer and an n-type semiconductor layer are connected for forming a p-n junction. When the inorganic light emitting diode is driven by a current, electrons are provided from the n-type semiconductor layer and holes are provided from a p-type semiconductor layer. The electrons and the holes are combined M the p-n junction, thus a plurality of lights are generated.

In the aforementioned inorganic light emitting, diode, the lights generated from the p-n junction include a top emitting light and a side emitting light. However, owing to the geometric structure and the manufacturing process, to light intensity of the top emitting light is larger than a light intensity of the side emitting light. Therefore, enhancing the light intensity of the top emitting light is a critical problem.

For enhancing the light intensity of the top emitting light, various technologies have been developed. One method is to add an extra reflecting structure to the original light emitting diode structure. Thus, the side emitting light is reflected toward a light direction of the top emitting light, and the light intensity of the top emitting light is enhanced. Another method is to change the structure of the light emitting diode, thus the lights generated from the p-n junction can be collected toward the light direction of the top emitting light.

However, in the light enhancing method of the aforementioned examples, either the added reflecting structure or the changed light emitting diode structure have drawback of complicated manufacturing process, and extra equipment are required, therefore the manufacturing cost is high.

SUMMARY

According to one aspect of the present disclosure, a light enhancing structure for a light emitting diode is provided. The light enhancing structure includes a light emitting diode unit and at least one coating layer. The light emitting diode unit includes a plurality of surfaces and a light-emitting surface. The light-emitting surface is for allowing a plurality of lights generated inside the light emitting diode unit to emit through. The coating layer is formed on the surfaces for blocking or reflecting one of the lights generated inside the light emitting diode unit, and a light intensity of the light emitting diode unit is enhanced.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
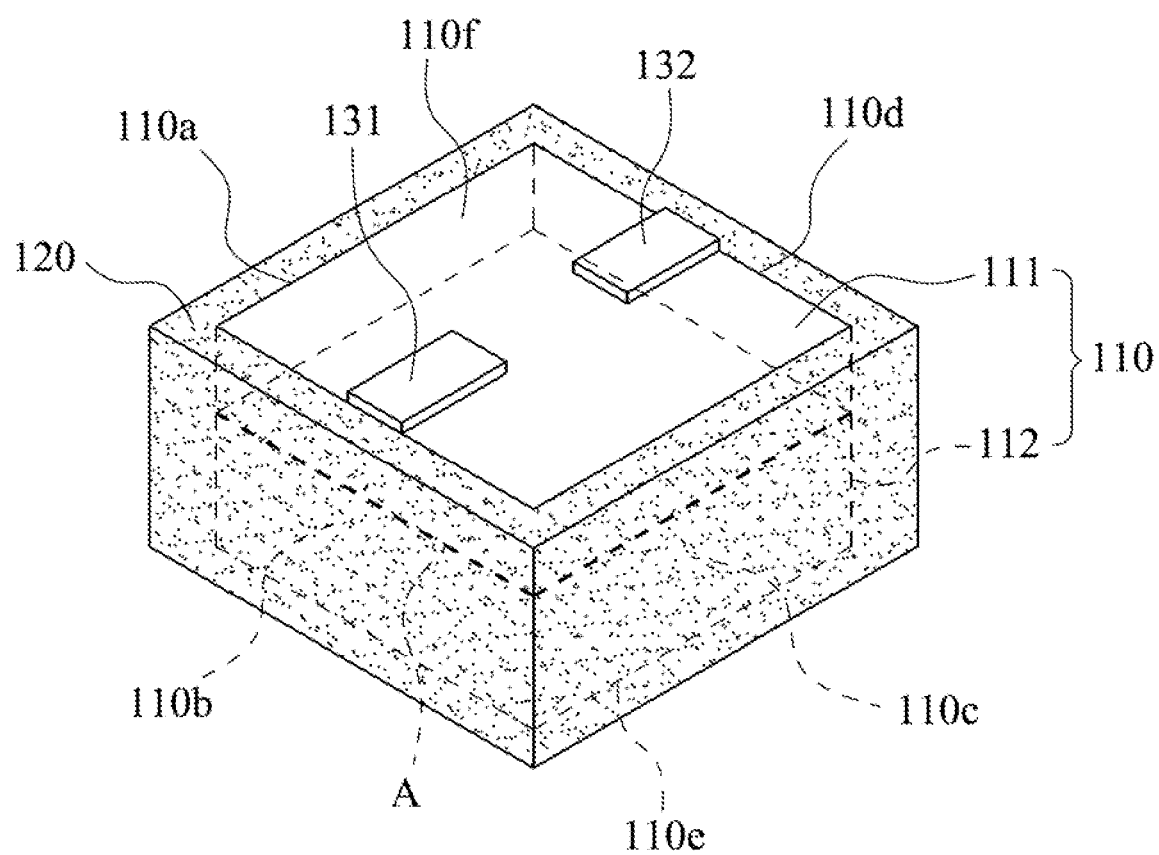
FIG. 1 is a schematic view showing a light enhancing structure for a light emitting diode according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

The present disclosure provides a light enhancing structure for a light emitting diode. At least one coating layer is formed on the surfaces except for the light-emitting surface. The coating layer can be a single layer structure or a multiple layer structure. The coating layer is for blocking or reflecting the side emitting light generated inside the light emitting diode unit, therefore, the stray lights are reduced, or a light direction of the side emitting light can be changed toward the light direction of the top emitting light. Therefore, a light intensity of the light emitting diode unit is enhanced.

FIG. 1 is a schematic view showing a light enhancing structure 100 for a light emitting diode according to one embodiment of the present disclosure. The light enhancing, structure 100 includes a light emitting diode unit 110 and at least a coating layer 120.

The light emitting diode unit 110 can be a vertical electrode type or a horizontal electrode type. In FIG. 1, it is an example of the light emitting diode unit 110 as a horizontal type. The light emitting diode unit 110 also includes an electrode 131 and an electrode 132. The light emitting diode unit 110 can include a base (not shown) or be without a base.

The light emitting diode unit 110 is formed by stacking of multiple semiconductor layers. The semiconductor layers include at least a p-type semiconductor layer 111 and at least an n-type semiconductor layer 112. A p-n junction A is formed at an interface between the p-type semiconductor layer 111 and the n-type semiconductor layer 112.

The light emitting diode unit 110 can be a hexahedron, which includes five surfaces 110a~110e and a light emitting surface 110*f*. In the embodiment, the surfaces 110*a*~110*d* are substantially perpendicular to the p-n junction A, and the light-emitting surface 110*f* and the surface 110*e* are substantially parallel to the p-n junction A. In the view point of FIG. 1, the surface 110*a*~110*d* can be referred as side surfaces of a hexahedron, the light-emitting surface 110*f* can be referred as a top surface of the hexahedron, and the surface 110*e* can be referred as a bottom surface of the hexahedron.

The coating layer 120 can be formed on the surfaces 110*a*~110*d* by evaporation, sputtering or other methods. The coating layer 120 can be made of a polymer, an inorganic compound or a metal. The metal can be Al, Pt, Au, Ag, Zn or Cu. The coating layer 120 is used for blocking or reflecting a portion of lights generated from the p-n junction A inside the light emitting diode unit 110. Preferably, a thickness of the coating layer 120 is 0.1 µm to 20 µm, thus the thickness is optimized for obtaining a better light blocking effect or a better light reflecting effect.

Figure 2A:
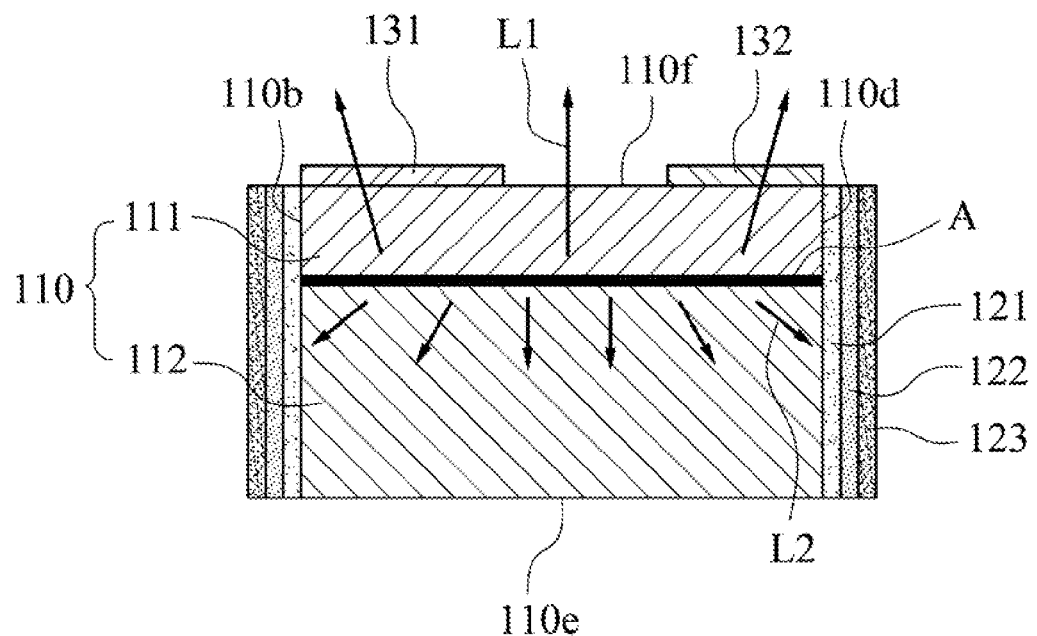
FIG. 2A is a section view showing light paths of the light enhancing structure of FIG. 1.

FIG. 2A is a section view showing light paths of the light enhancing structure 100 of FIG. 1. A number of the coating layer 120 is not limited. The number of the coating layer can be one, two or more. Preferably, the number of the coating layer is three. In FIG. 2A, a first coating layer 121, a second coating layer 122 and a third coating layer 123 are stacked orderly on the surfaces 110*a*~110*d*.

The first coating layer 121, the second coating layer 122 or the third coating layer 123 can be made of a polymer, an inorganic compound or a metal, respectively. Furthermore, the material of the first coating layer 121, the second coating layer 122 or the third coating layer 123 can be different or identical. For example, the first coating layer 121 and the third coating layer 123 can be made of polymers, and the second coating layer 122 can be made of a metal. The metal can be Al, Pt, Au, Ag, Zn or Cu. In another example, the first coating layer 121, the second coating layer 122 or the third coating layer 123 can be an inorganic compound, respectively. The inorganic compound can be $ZrO_2$, $TiO_2$, $BaSO_4$, $SiO_2$, AlN or $Al_2O_3$.

When the first coating layer 121 and the third coating layer 123 are made of polymers protection effects such as electrical isolation, anti-moisture, and anti-oxidation can be achieved. Therefore, protection effects are applied to the light emitting diode unit 110 and the second coating layer 122 by the first coating layer 121 and the third coating layer 123. Thus, a higher life time of the light emitting diode unit 110 is obtained.

Generally, at least one top emitting light L1 and at least one side emitting light L2 are generated from the p-n junction A inside of the light emitting diode unit 110. In FIG. 2A, when the side emitting light L2 is emitted to the first coating layer 121, the second coating layer 122 or the third coating layer 123, it will be blocked by those coating layers. In detail, the side emitting light L2 is mainly blocked by the second coating layer 122. At the time, owing to the side emitting light L2 is inhibited, thereby an influence of a stray light is reduced. Therefore, a light intensity of the top emitting light L1 is enhanced. When a single layer structure is used, i.e., only one of the first coating layer 121, the second coating layer 122, or the third coating layer 123 is used, a thickness of the first coating layer 121, the second coating layer 122 or the coating layer 123 can be 0.1 µm to 20 µm, respectively. When a three layer structure is used, a total thickness of the first, the second and the third coating layers (121, 122 and 123) is controlled 0.2 µm to 20 µm, thus a better light blocking effect is achieved.

Figure 2B:
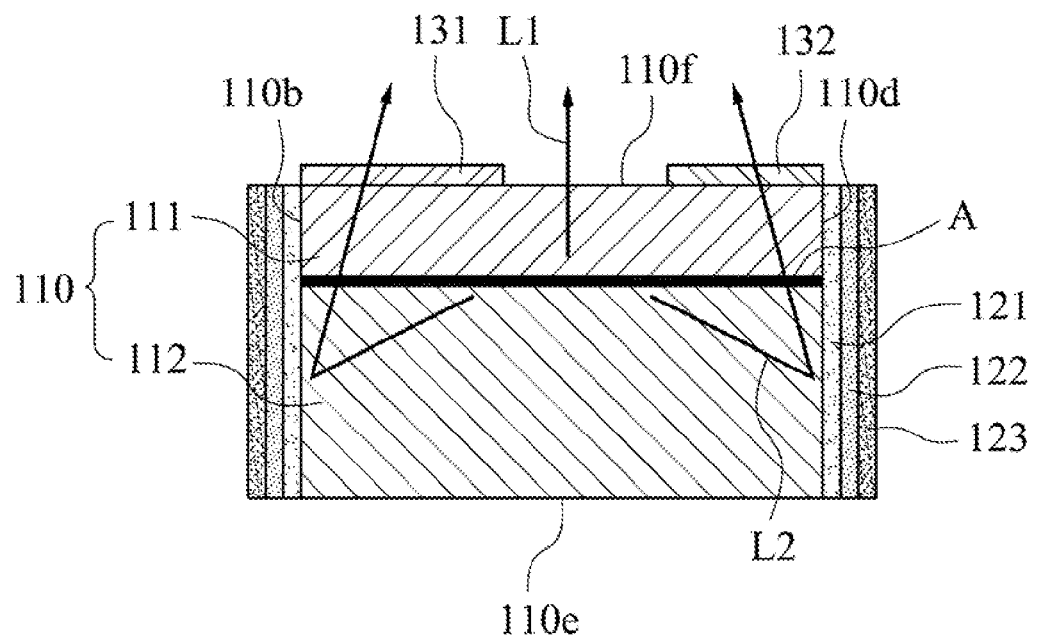
FIG. 2B is a section view showing light paths of a light enhancing structure according to another embodiment of the present disclosure.

FIG. 2B is a section view showing light paths of a light enhancing structure 100 according to another embodiment of the present disclosure. In FIG. 2B, when the side emitting light L2 is emitted to the first coating layer 121, the second coating layer 122 or the third coating layer 123, it will be reflected by those coating layers (121-123). Therefore, a light path of the side emitting light L2 is changed. In detail, the light path of the side emitting light L2 is mainly changed by the second coating layer 122, and is collected to toward the light direction of the top emitting light L1. Thus, the light intensity of the top emitting light L1 can be enhanced. In FIG. 2B, the materials and thicknesses of the first, the second and the third coating layers (121, 122 and 123) are similar to the aforementioned embodiments, the first coating layer 121 and the third coating layer 123 are made of polymers, and the second coating layer 122 is made of a metal, and the metal can be Al, Pt, Au, Ag, Zn or Cu.

Figure 3:
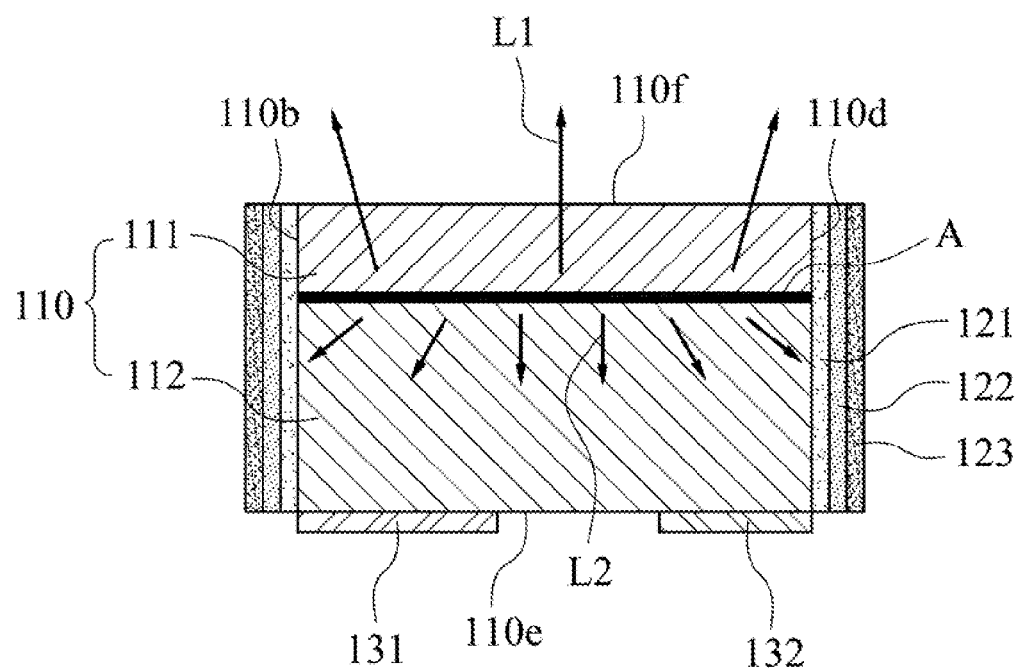
FIG. 3 is a section view showing still another embodiment of the light enhancing structure of FIG. 2A.

FIG. 3 is a section view showing still another example of the light enhancing structure 100 of FIG. 2A. In FIG. 3 a flip-chip type light emitting diode unit 110 is showed. Compared to FIG. 2A, the light direction of the top emitting light L1 in FIG. 3 is opposite to the surface which a first electrode 131 and a second electrode 132 are disposed thereon. Without blocking by the fist electrode 131 and the second electrode 132, a higher light intensity is achieved. In FIG. 3, the first coating layer 121, the second coating layer 122 or the third coating layer 123 can block or reflect the side emitting light L2 in order to enhance the light intensity of the top emitting light L1. In FIG. 3, the materials and thicknesses of the first, the second and the third coating layers (121, 122 and 123) are similar to the aforementioned embodiments, which will not be repeated herein.

Figure 4:
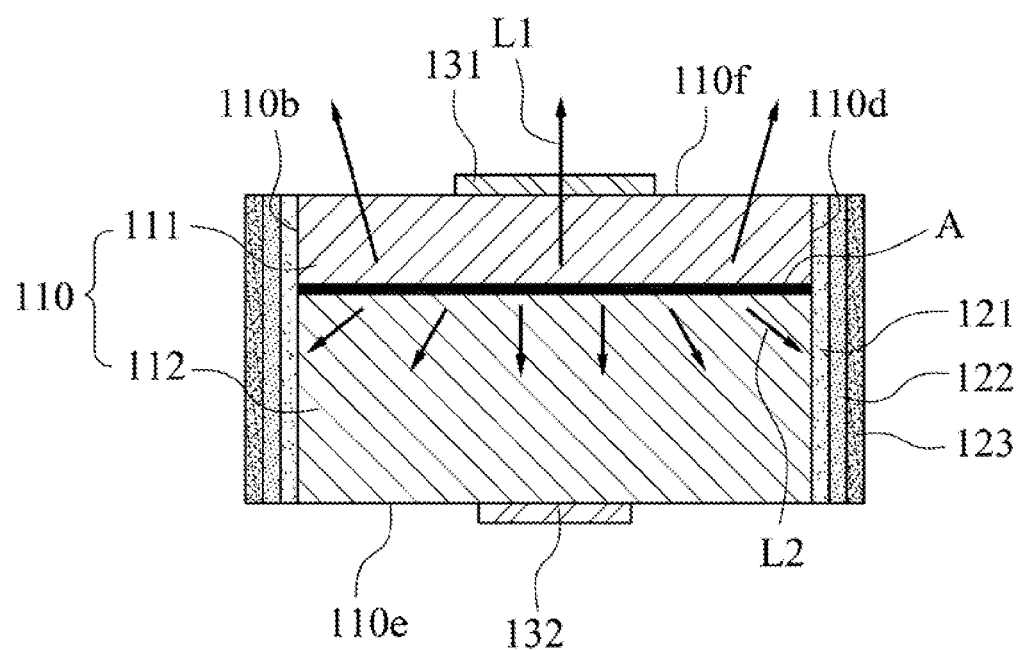
FIG. 4 is a schematic view showing further another embodiment of the light enhancing structure of FIG. 2A.

FIG. 4 is a schematic view showing further another example of the light enhancing structure 100 of FIG. 2A. In the present disclosure, the arrangements of the electrodes of the light emitting diode unit 110 are not limited. In FIG. 2, a horizontal electrode type is showed, where in FIG. 4, a vertical electrode type is showed. In FIG. 4, the first electrode 131 and the second electrode 132 are utilized for an electrical conduction. In FIG. 4, the first coating layer 121, the second coating layer 122 or the third coating layer 123 can block or reflect the side emitting light L2 in order to enhance the light intensity of the top emitting light L1. In FIG. 4, the materials and thicknesses of the first, the second and the third coating layers (121, 122 and 123) are similar to the aforementioned embodiments, which will not be repeated herein.

Figure 5:
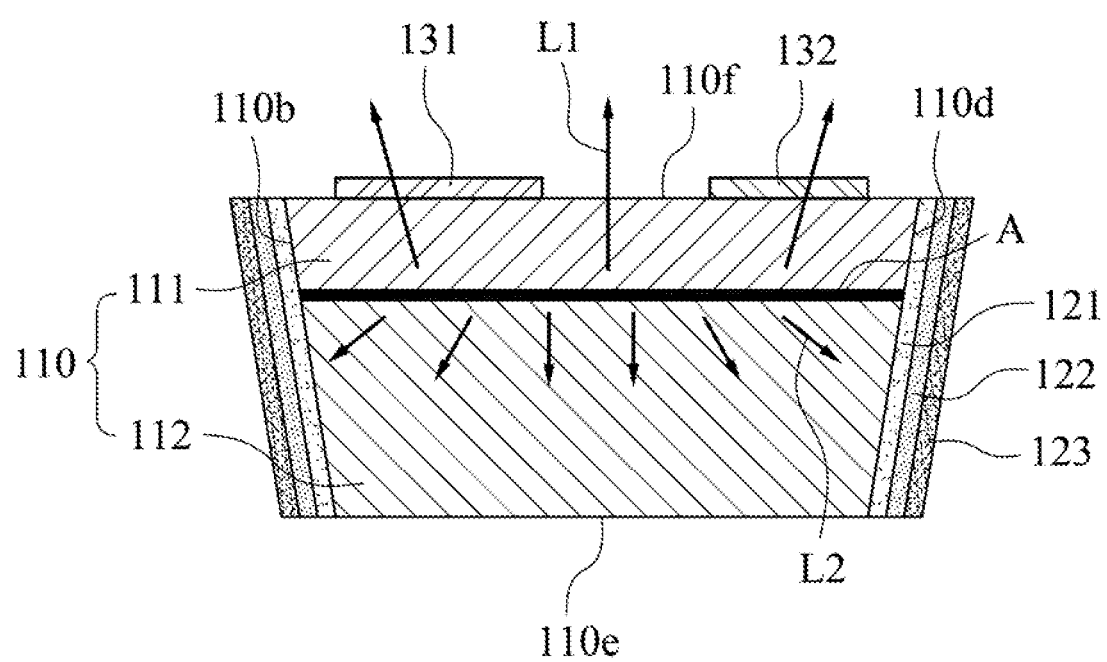
FIG. 5 is a schematic view showing another embodiment of the light enhancing structure of FIG. 1A.

FIG. 5 is a schematic view showing another example of the light enhancing structure 100 of FIG. 2A. In FIG. 5, for achieving a better light enhancing effect, the surfaces 110*a*~110*d* can be formed as inclined surfaces, therefore, various light reflecting angles are obtained, and a better light reflecting effect can be obtained, too.

In conclusion, the present disclosure provides a light enhancing structure for a light emitting diode. The light enhancing structure includes a light emitting diode unit and at least one coating layer. The coating layer is formed on some of the surfaces of the light emitting diode unit. The coating layer is used for blocking or reflecting the side emitting light emitted from the p-n junction, thereby enhancing the light intensity of the top emitting light, and a lighting efficiency is enhanced. The light enhancing structure of the present disclosure has an advantage of simple manufacturing process, and can be manufactured by a commercially available light emitting diode chip. Therefore, extra equipment is not required, and the manufacturing cost and the manufacturing time can be reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A light enhancing structure for a light emitting diode comprising:
    a light emitting diode unit comprising a plurality of surfaces and a light-emitting surface, wherein the surfaces comprises side surfaces and a surface configured for locating electrodes, and the light-emitting surface is for allowing a plurality of lights generated inside the light emitting diode unit to emit through; and
    three coating layers stacked in sequence on the side surfaces for blocking or reflecting one of the lights generated inside the light emitting diode unit, whereby a light intensity of the light emitting diode unit is enhanced;
    wherein the coating layers are not contacted with the light-emitting surface and the surface where the electrodes located;
    wherein the three coating layers are a first coating layer, a second coating layer and a third coating layer the first coating layer is directly contacted with the side surfaces of the light emitting diode unit and is made from a polymer or an inorganic compound, the second coating layer is contacted with the first coating layer and is made from a metal, the third coating layer is contacted with the second coating layer and is made from a polymer or an inorganic compound.

2. The light enhancing structure for the light emitting diode of claim 1, wherein a total thickness of the coating layers is 0.2 μm to 20 μm.

3. The light enhancing structure for the light emitting diode of claim 1, wherein a thickness of each of the coating layer is 0.1 μm to 20 μm.

4. The light enhancing structure for the light emitting diode of claim 1, wherein the metal is Al, Pt, Au, Ag, Zn or Cu.

5. The light enhancing structure for the light emitting diode of claim 1, wherein the inorganic compound is $ZrO_2$, $TiO_2$, $BaSO_4$, $SiO_2$, AlN or $Al_2O_3$.

6. The light enhancing structure for the light emitting diode of claim 1, wherein the lights generated inside the light emitting diode unit comprises at least one top emitting light and at least one side emitting light, and the coating layers are for blocking or reflecting the side emitting light.

7. The light enhancing structure for the light emitting diode of claim 1, wherein the light emitting diode unit is a vertical electrode type, a horizontal electrode type or a flip chip type.

8. The light enhancing structure for the light emitting diode of claim 1, wherein each of the surfaces is an inclined surface or a vertical surface.

* * * * *